(12) United States Patent
Wilson et al.

(10) Patent No.: US 7,680,217 B2
(45) Date of Patent: Mar. 16, 2010

(54) METHODS AND SYSTEMS FOR CODING OF A BANG-BANG DETECTOR

(76) Inventors: William B. Wilson, 4964 Briarwood Dr., Macungie, PA (US) 18062; Mark Trafford, 1 Mildred La., Fleetwood, PA (US) 19522

( * ) Notice: Subject to any disclaimer, the term of this patent is extended or adjusted under 35 U.S.C. 154(b) by 727 days.

(21) Appl. No.: 11/540,481

(22) Filed: Sep. 28, 2006

(65) Prior Publication Data
US 2008/0080656 A1    Apr. 3, 2008

(51) Int. Cl.
*H04L 27/00*    (2006.01)
(52) U.S. Cl. .................. 375/326; 375/371; 375/375; 375/376
(58) Field of Classification Search .......... 375/326, 375/371–376
See application file for complete search history.

(56) References Cited

U.S. PATENT DOCUMENTS

| | | | | |
|---|---|---|---|---|
| 3,842,412 A | * | 10/1974 | Spofford, Jr. | ............... 341/119 |
| 6,317,071 B1 | * | 11/2001 | Kolsrud et al. | .............. 341/155 |
| 2002/0008653 A1 | * | 1/2002 | Nishimura | .................. 341/154 |
| 2005/0089123 A1 | * | 4/2005 | Spiegel | ....................... 375/345 |
| 2005/0220181 A1 | * | 10/2005 | Rasmussen | ................. 375/226 |
| 2007/0253475 A1 | * | 11/2007 | Palmer | ....................... 375/229 |

* cited by examiner

*Primary Examiner*—Curtis B Odom
(74) *Attorney, Agent, or Firm*—Hamilton, DeSanctis & Cha

(57) ABSTRACT

Various apparatus and methods for related to clock recovery are disclosed. For example, in one illustrative embodiment, a clock recovery circuit includes a coding circuit adapted to translate a stream of first digital numbers derived from a source signal into a stream of first binary numbers and a stream of second binary numbers, a digital-to-analog converter (DAC) circuit coupled to the coding circuit and configured to provide an analog output based on the streams of first and second binary numbers and a voltage-controlled oscillator (VCO) controlled by the analog output of the DAC circuit and adapted to produce a base clock having a base clock frequency.

26 Claims, 9 Drawing Sheets

METHODS AND SYSTEMS FOR CODING OF A BANG-BANG DETECTOR

BACKGROUND

Designers of communication systems have often used multi-phased, low-frequency clocks to sample high-speed data streams in phase-locked loop (PLL)-based clock and data recovery circuits (CDRs). One advantage to using such systems is that traditional bang-bang phase detector circuits can be used at relatively low clock frequencies. For example, it is well described in the relevant literature to use a four-phased clock to cause four separate phase detectors to sample an incoming data stream. The outputs of the four phase detectors are then continuously updated at the based clock frequency to form a sequence of data words. The data words, in turn, are converted to analog form using a digital-to-analog (DAC) converter and used to control a voltage-controlled oscillator (VCO).

Unfortunately, the above-described system requires the use of a DAC having a relatively large number of bits while operating at a very high frequency. While it is possible to use individual DACs (typically 1.5 bits) for each phase-detector, this approach requires that signal addition occur in the analog domain and that phase error information be elongated for an undesirable length of time. While this problem may be corrected using time-domain multiplexing circuitry to combine consecutive phase-error signals into a single stream, this approach requires that the DAC and other circuitry operate at high frequencies, which as stated above can be difficult to implement.

Thus, new technology directed to improving clock recovery circuits is desirable.

SUMMARY

In an illustrative embodiment, a clock recovery circuit includes a coding circuit adapted to translate a stream of first digital numbers derived from a source signal into a stream of first binary numbers each ranging from 0 to N and a stream of second binary numbers each ranging from 0 to −N, wherein N is a positive integer, a current control device coupled to the coding circuit and configured to provide an analog output based on the streams of first and second binary numbers and a voltage-controlled oscillator (VCO) controlled by the analog output of the DAC circuit and adapted to produce a base clock having a base clock frequency.

In another illustrative embodiment, a clock recovery circuit includes a bank of multiple analog-to-digital converters (ADCs) with each ADC adapted to sample a common source signal using a respective output clock signal of a multi-phased clock device to produce a stream of digital output samples, an adding device adapted to add the last output sample of the stream of digital output samples of each of the ADCs, a coding means coupled to the adding means for converting first digital signals derived from the adding device into a stream of first binary numbers each ranging from 0 to N and a stream of second binary numbers each ranging from 0 to −N, wherein N is a positive integer and a conversion means for providing an analog control signal to a voltage controlled oscillator based on the first and second streams of binary numbers.

In yet another illustrative embodiment, a method for performing clock recovery for a source signal includes digitally sampling the source signal to produce digital samples at a rate 4 times that of a base clock frequency and at a resolution of 1.5 bits to produce a stream of digital samples, digitally adding the last 4 digital samples of the stream of digital samples to produce a stream of digital sums, coding either the stream of digital sums or a stream of digital filtered sums derived from the stream of digital sums into two separate streams of binary numbers, converting the two separate streams of binary numbers into a single analog output using a positive current mirror and a negative current mirror and providing the analog output to a voltage controlled oscillator.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
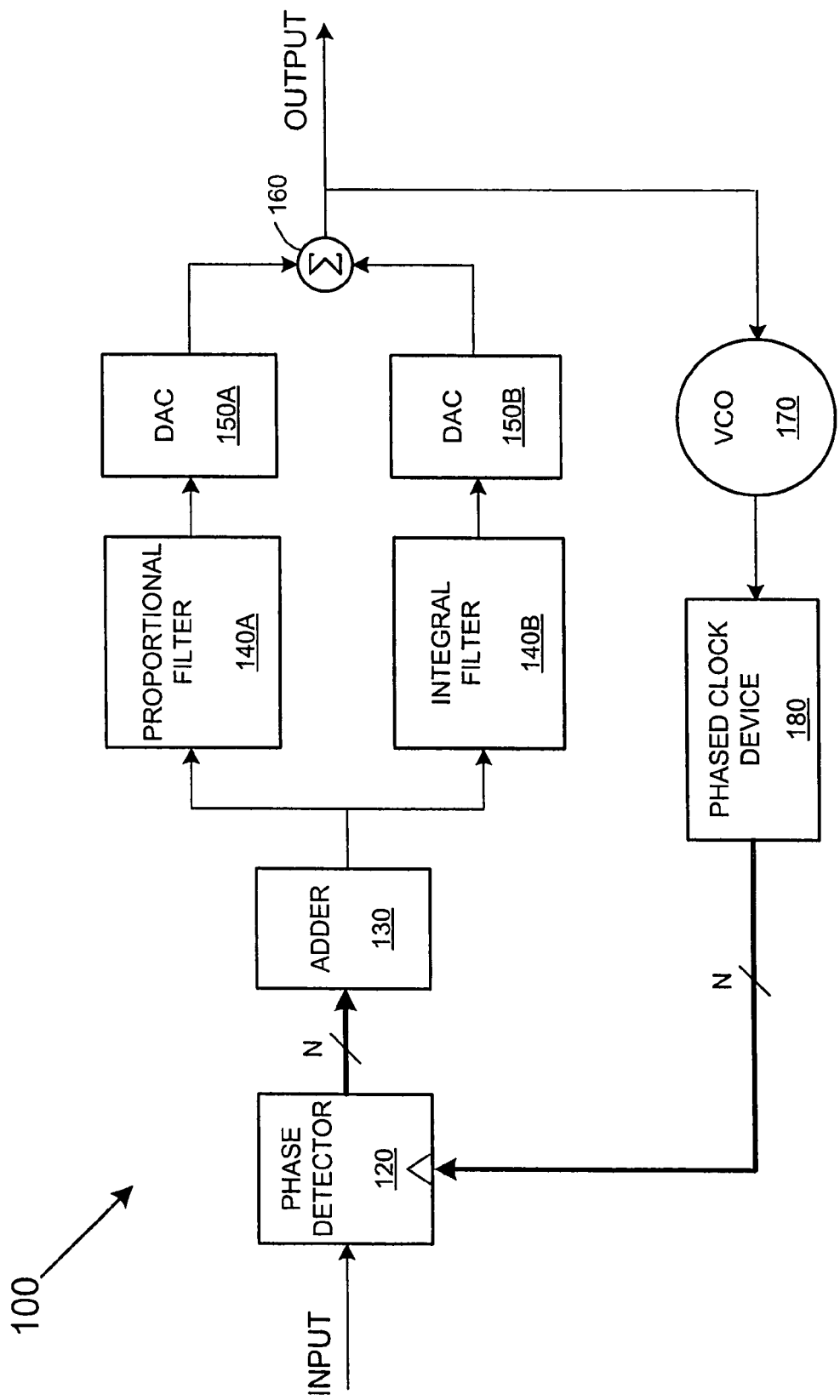
FIG. 1 is an exemplary clock recovery circuit in accordance with an illustrative embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatus and methods may be omitted so as to not obscure the description of the example embodiments. Such methods and apparatus are clearly within the scope of the present teachings.

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

The various advantages offered by the disclosed methods and systems include providing an inexpensive, yet capable, clock recovery system where the problems associated with high-speed digital-to-analog (DAC) converters are substantially obviated.

FIG. 1 is an exemplary clock recovery circuit 100 in accordance with an illustrative embodiment. As shown in FIG. 1, the exemplary clock recovery circuit 100 includes a phase detector 120, a digital adder 130, a proportional filter 140A linked to a first digital-to-analog converter (DAC) 150A, an integral filter 140B linked to a second DAC 150B, an analog adder 160, a voltage-controlled oscillator (VCO) 170 and a phased-clock device 180.

In operation, a source signal, typically a communications signal with both a clock and data embedded within, can be presented to the phase detector input 120. Simultaneously, the VCO 170 and phased clock device 180 can work together to provide a number of phase-related clock signals to the phase detector. Using the phase-related clock signals, the phase detector input 120 can act as a plurality of analog-to-digital converters (ADCs) to sample the source signal upon a clock transition of each phase-related clock signal. The results of each sample can then be provided to the adder 130.

Figure 2:
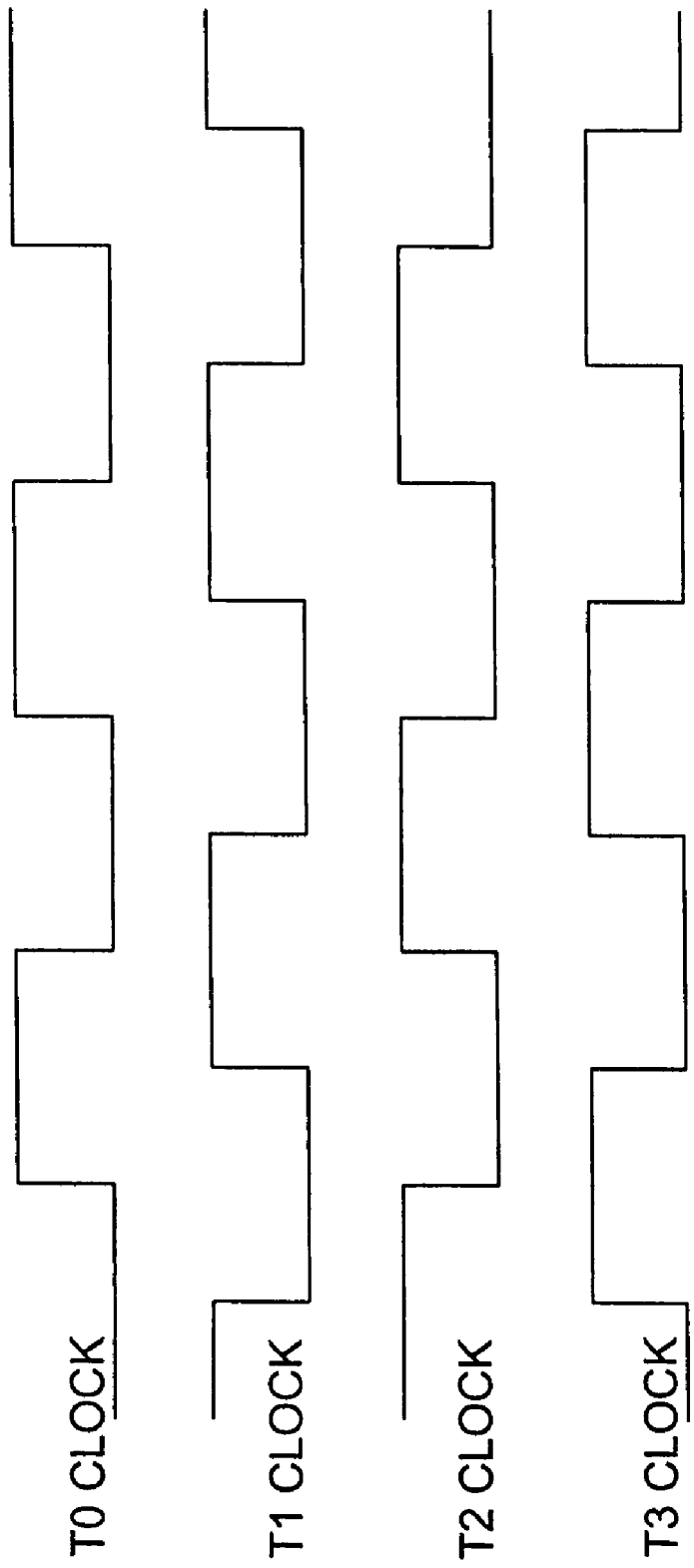
FIG. 2 depicts a four-phase timing pattern used to perform high-speed sampling for the exemplary clock recovery circuit of FIG. 1.

FIG. 2 depicts a four-phase timing pattern used to perform high-speed sampling according to an illustrative embodiment. As shown in FIG. 2, the timing pattern includes four clock signals T0, T1, T2 and T3. Each of the exemplary four clock signals T0, T1, T2 and T3 has a square-wave shape and operates as what will be referred to in the present disclosure as a "base frequency" or "base clock rate". Note that the base frequency will typically be an integer fraction of the frequency of an embedded clock of a source signal. Also note that the four clock signals T0, T1, T2 and T3 transition at phase angles of 0°, 90°, 180° and 270° relative to clock signal T0, which can be referred to as the base clock.

Figure 3:
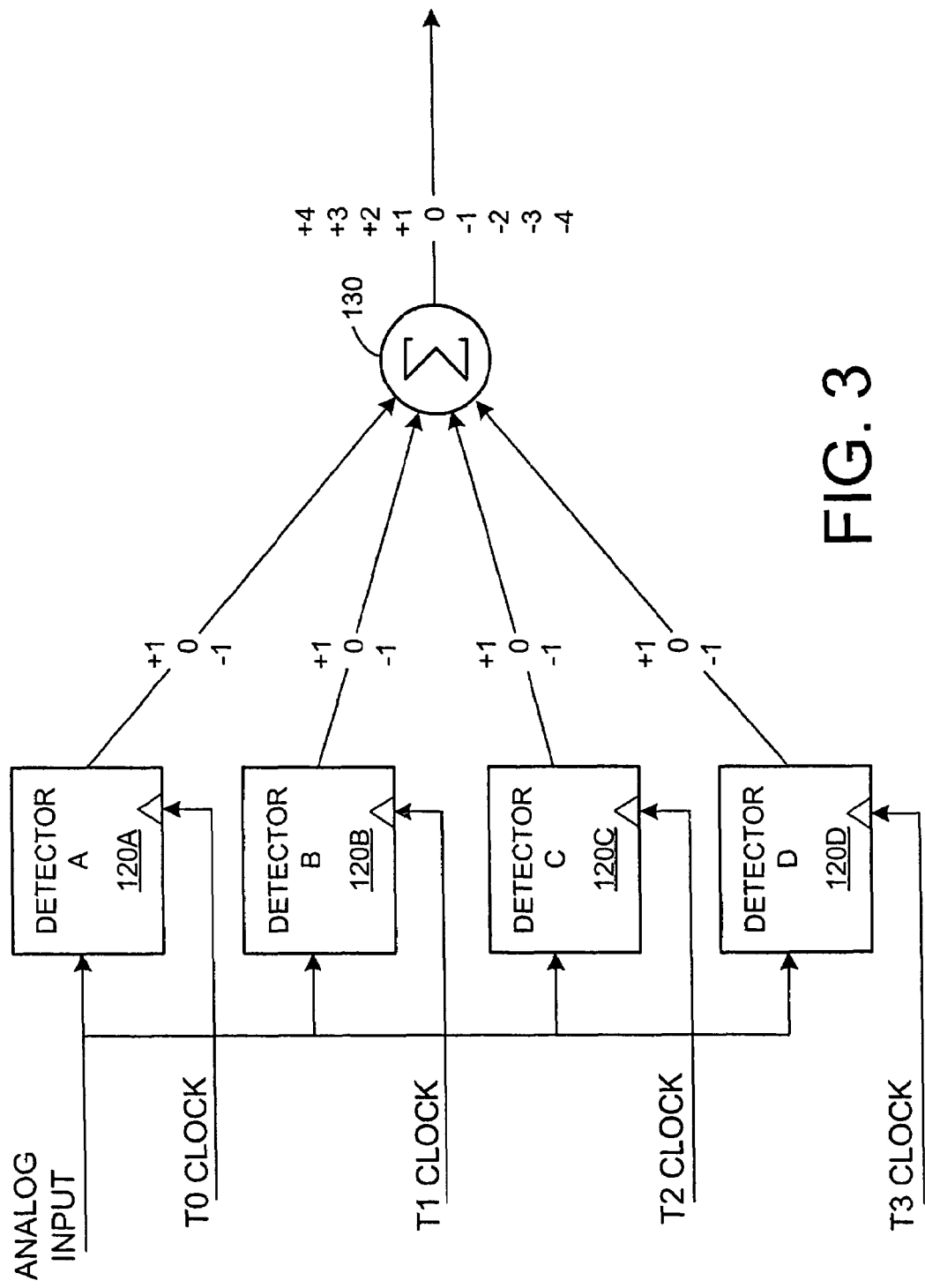
FIG. 3 depicts details of a data acquisition system used in the exemplary clock recovery circuit of FIG. 1 according to an illustrative embodiment.

Continuing, FIG. 3 depicts details of the data acquisition system used in the exemplary clock recovery circuit of FIG. 1. That is, FIG. 3 depicts details of the detector 120 and digital adder 130 of FIG. 1 along with their relationship to the aforementioned clock signals T0, T1, T2 and T3. As shown in FIG. 3, the detector 120 of FIG. 1 is conceptually divided into four detectors A, B, C and D that are respectively controlled by clock signals T0, T1, T2 and T3. Upon sensing a rising edge from its respective clock, each of the four detectors A, B, C and D can sample its input and provide a "bang-bang" output of +1, 0 or −1, which in the relevant arts qualifies the detectors A, B, C and D as having a resolution of 1.5 bits. Known J. D. H. Alexander "Clock Recovery from Random Binary Signals" Electronics Letters, Vol. 11, No. 22, p. 541, 542, October 1975.

After each of the detectors A, B, C and D has sampled the common analog input, the output of each detector A, B, C and D is fed to the digital adder 130 after resynchronization (not shown), which converts the four 1.5 bit samples into a single four-bit sum/word having a range of −4 to +4.

Note that while for the present example the digital adder 130 produces a single sum at the base clock rate such that each detector A, B, C and D provides but a single sample per sum, in other embodiments it can be possible for the digital adder 130 to provide a sum after each detector A, B, C or D provides a sample such that the digital adder 130 provides a stream of sums/words at four times the base clock rate.

Returning to FIG. 1, as the digital adder 130 produces its stream of sums/words, the stream of sums/words can be provided to the two filters, which operate in parallel and can serve different functions. The integral filter 140B with its DAC 150B are used to provide the clock recovery circuit with long-term accuracy. Essentially, the integral filter 140B acts as an integrator such that the clock recovery circuit behaves like a type 2 control system such that the VCO 170 should not have any permanent error. Note that the integral filter 140B with its respective DAC 150B can operate at speeds far below the base frequency, but may have a relatively high resolution far exceeding four bits. In embodiment where DAC 150B updates at a relatively low frequency, the DAC can provide a high resolution output with little difficulty.

The proportional filter 140A with its respective DAC 150A serve a much different function. Their purpose is not to provide long-term accuracy but to eliminate jitter. Accordingly, while in many embodiments it is not necessary for the proportional filter 140A with its respective DAC 150A to have a high degree of resolution, it can be advantageous to use a proportional filter and DAC that can operate at the base frequency or perhaps even higher, e.g., 2 or 4 times the base frequency.

In operation, the proportional filter 140A typically acts as a multiplier, but in other embodiments may provide frequency filtering/shaping. In other embodiments the proportional filter 140 can be eliminated altogether or be thought of as a unity multiplier and/or as a delay. As the proportional filter 140A acts upon the stream of incoming sums/words provided by the digital adder 130, the proportional filter 140 can provide a stream of filtered sums/words to the DAC 150.

The DAC 150, in turn, can receive the stream of filtered sums/words to the DAC 150 and convert them to analog form. Note, however, that because the present DAC may need to operate at extremely high frequencies, it can be beneficial to devise special DAC architectures.

Figure 4:
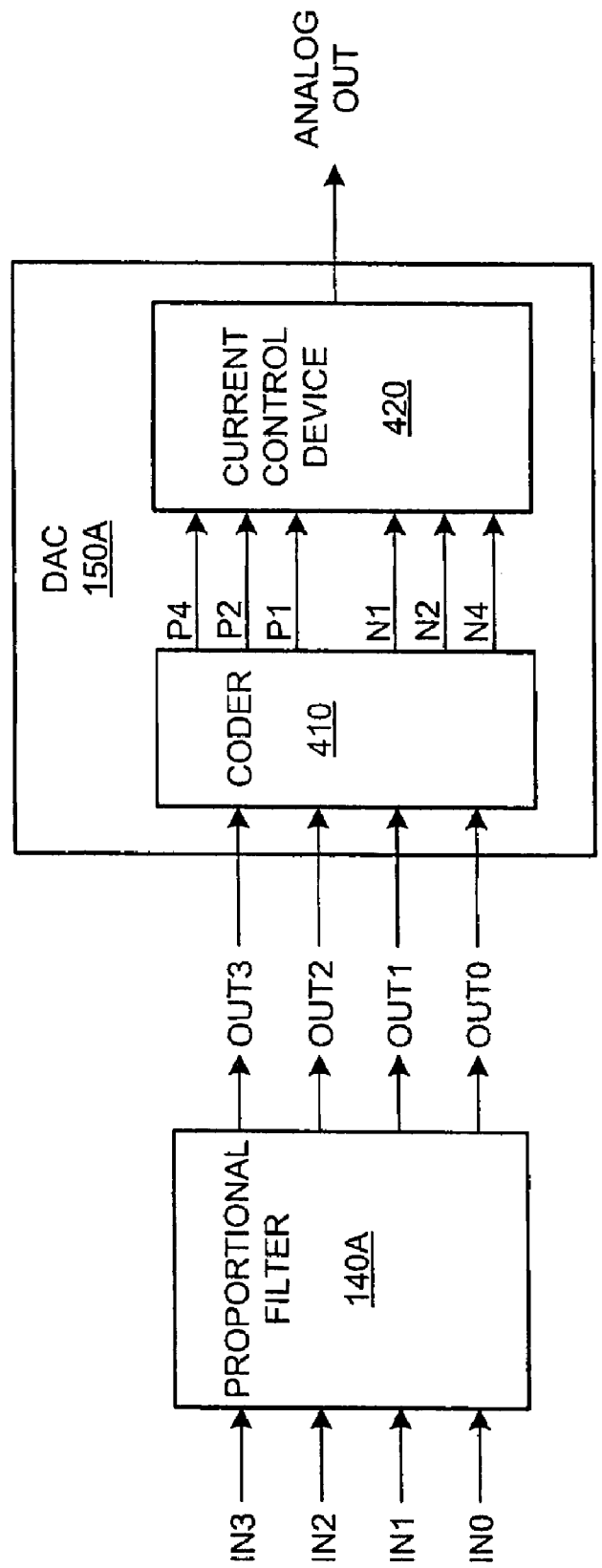
FIG. 4 depicts details of a portion of an exemplary digital-to-analog conversion system used in the exemplary clock recovery circuit of FIG. 1 according to an illustrative embodiment.

FIG. 4 depicts details of a portion of an exemplary DAC 150A used in the clock recovery circuit of FIG. 1 according to an illustrative embodiment. As shown in FIG. 4, the exemplary DAC 150A includes a coder 410 and a current control device 420.

In operation, the internal coder 410 of the exemplary DAC 150A can receive the aforementioned stream of filtered sums/words from the proportional filter 140A. As shown in FIG. 4, the resolution of the filtered sums/words is limited to four bits, but of course other embodiments may employ higher or lower resolutions.

As the filtered sums/words are received by the internal coder 410, the internal coder 410 can translate the stream of filtered sums/words into two separate hybrid words of three-bits each. A first (positive) word is encoded using three bit-lines P1, P2 and P4; a second (negative) word is encoded also using three bit-lines N1, N2 and N4. A translation table is provided below:

TABLE 1

| INPUT | P4 | P2 | P1 | N4 | N2 | N1 | OUTPUT (normalized) |
|---|---|---|---|---|---|---|---|
| −4 | 1 | 0 | 0 | 0 | 0 | 0 | +1.00 Volt |
| −3 | 0 | 1 | 1 | 0 | 0 | 0 | +0.75 Volt |
| −2 | 0 | 1 | 0 | 0 | 0 | 0 | +0.50 Volt |
| −1 | 0 | 0 | 1 | 0 | 0 | 0 | +0.25 Volt |
| 0 | 0 | 0 | 0 | 0 | 0 | 0 | 0.00 Volt |
| 1 | 0 | 0 | 0 | 0 | 0 | 1 | −0.25 Volt |
| 2 | 0 | 0 | 0 | 0 | 1 | 0 | −0.50 Volt |
| 3 | 0 | 0 | 0 | 0 | 1 | 1 | −0.75 Volt |
| 4 | 0 | 0 | 0 | 1 | 0 | 0 | −1.00 Volt |

As shown in Table 1 above, the exemplary translation is akin to separating the positive and negative input values and rendering two unsigned binary numbers: a positive binary number for a positive input range of {0 . . . 4} and a negative binary number for a negative input range of {0 . . . −4}.

Figure 5:
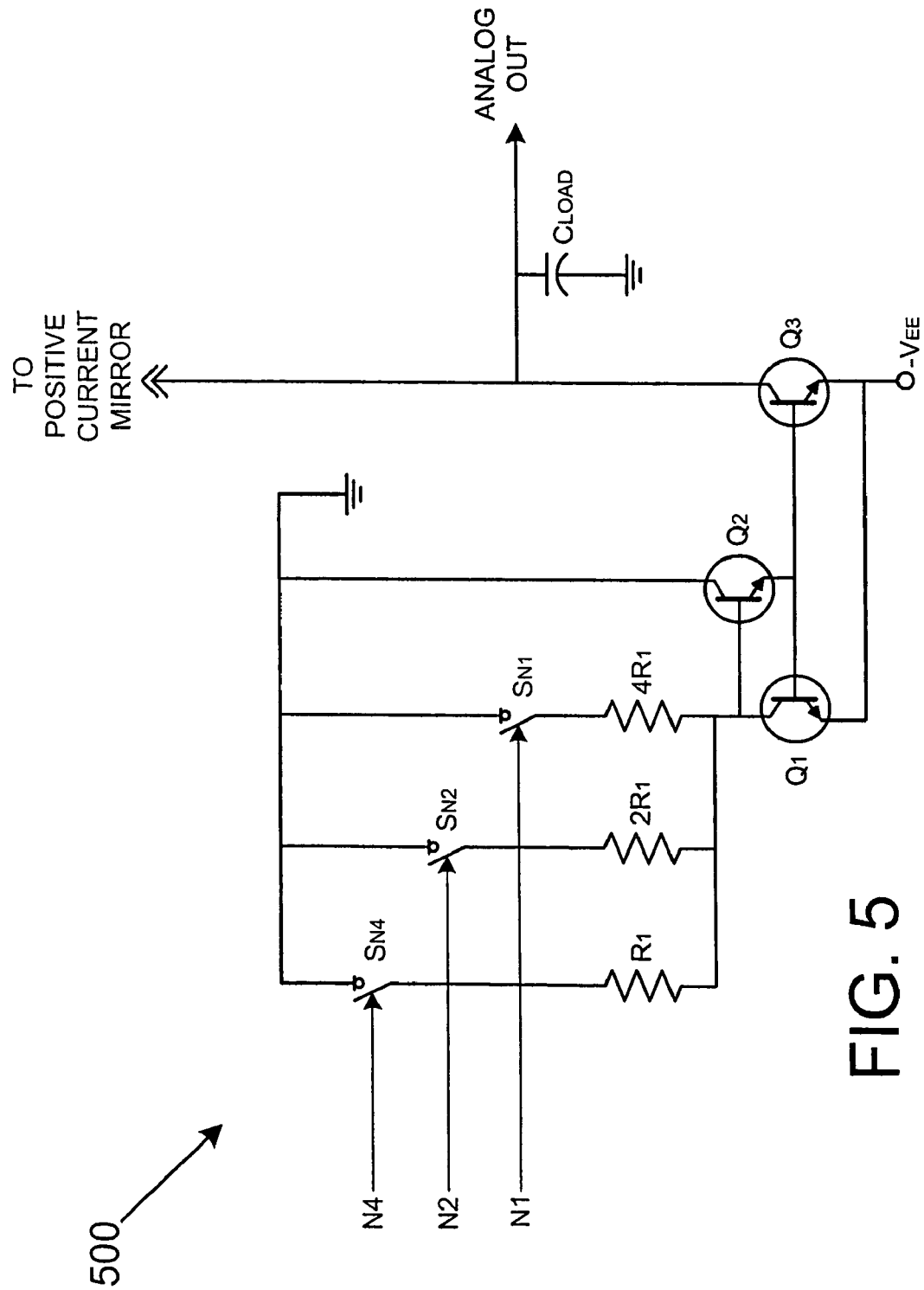
FIG. 5 depicts details of a portion of an exemplary current mirror used in the exemplary digital-to-analog conversion system of FIG. 4 according to an illustrative embodiment.

The translation of Table 1 is shaped in a way so as to complement the current control device 420 in a way that will allow the current control device 420 to quickly and accurately translate the digital input into a bipolar analog output. The exemplary current control device 420 consists of two current mirrors: one to receive the positive inputs P1, P2 and P4 and provide a positive current source; and one to receive the negative inputs N1, N2 and N4 to provide a negative current source; and FIG. 5 depicts details of an exemplary negative current mirror 500 used in the digital-to-analog conversion system of FIG. 4 according to an illustrative embodiment. It should be appreciated that the exemplary negative current mirror 500 is but one of a large number of current mirror configurations found in the relevant art and accordingly in other embodiments any number of different current mirror configurations can be used. It should also be appreciated that the exemplary negative current mirror 500 can be accompanied by a positive current mirror counterpart that for the sake of simplicity of explanation is omitted from FIG. 5. However, positive current mirrors are known in to those in the related arts and it is assumed that the concepts presented for the exemplary negative current mirror 500 can apply to its positive current mirror counterpart.

As shown in FIG. 5, the exemplary current mirror 500 has three switches $S_{N1}$, $S_{N2}$ and $S_{N3}$ controlled by inputs N1, N2 and N4, respectively. Each of the three switches $S_{N1}$, $S_{N2}$ and $S_{N3}$ is in series with a respective resistor $R_1$, $R_2$ and $R_3$ that serves to provide a specific amount of current to transistors Q1 and Q2. Accordingly, a like amount of current running through transistor Q1 will also run through Q3, thus providing a desired analog output via capacitor $C_{LOAD}$ to the ANALOG OUT line. As current mirrors can be extremely fast devices, the combination of the current mirror 500 of FIG. 5 with the appropriate coding device, such as the coder 410 of FIG. 4, can serve to provide a very fast DAC.

Figure 6:
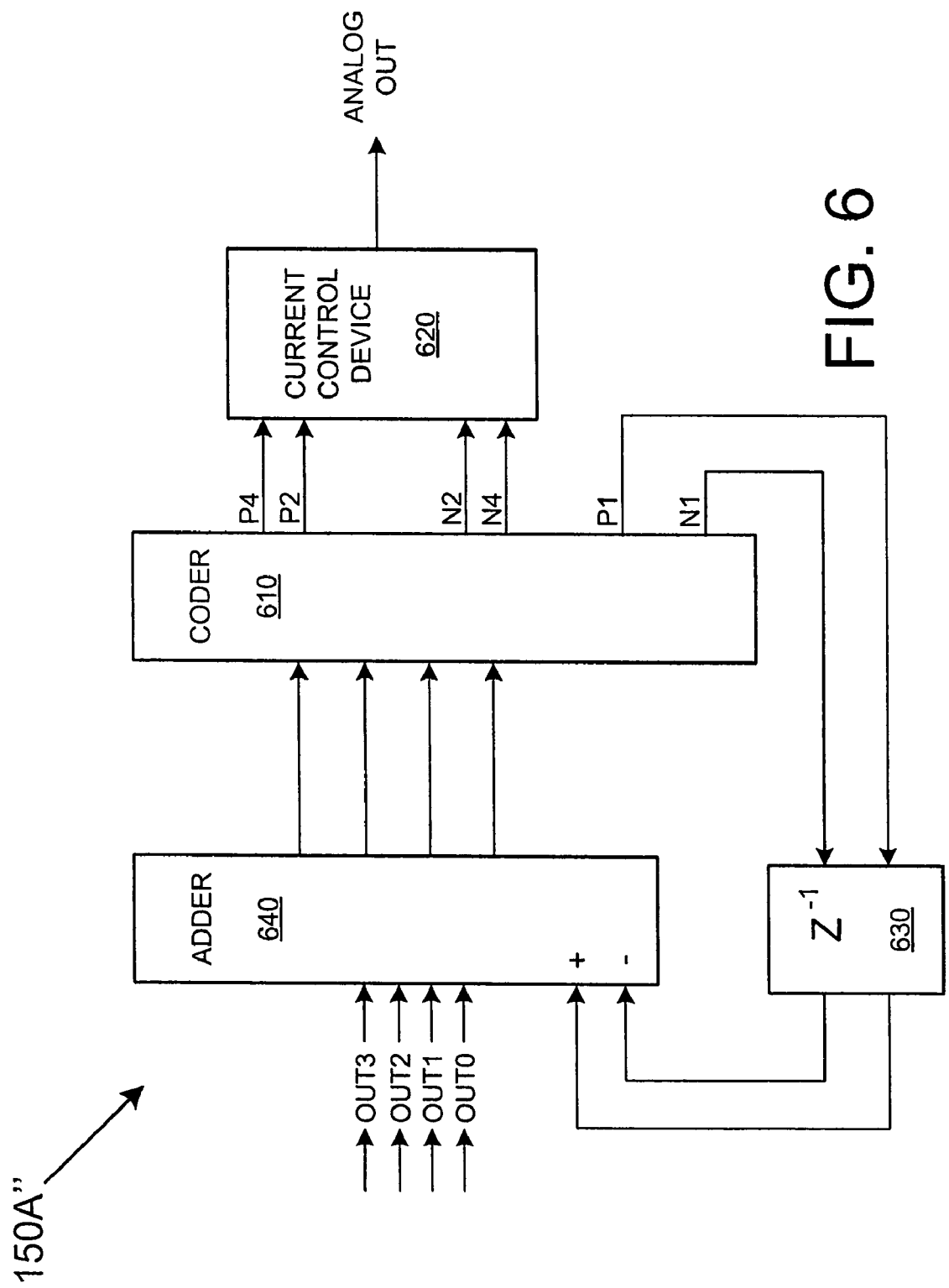
FIG. 6 depicts details of a portion of another exemplary digital-to-analog conversion system used in the clock recovery circuit of FIG. 1 according to an illustrative embodiment.

FIG. 6 depicts details of a portion of another exemplary digital-to-analog conversion system 150A" usable in the clock recovery circuit of FIG. 1 according to an illustrative embodiment. As shown in FIG. 6 the exemplary digital-to-analog conversion system 150A" includes an adder 640, a coder 610 and a current control device 620. While the present digital-to-analog conversion system 150A" is similar to that presented in FIG. 4, the present exemplary digital-to-analog conversion system 150A" makes a tradeoff between increased complexity in logic for a simpler and cheaper current control device.

In operation, the adder 640 of can receive the aforementioned stream of filtered sums/words from the proportional filter 140A of FIG. 1. As shown in FIG. 4, the resolution of the filtered sums/words is again limited to four bits, but of course other embodiments may employ higher or lower resolutions.

As the filtered sums/words are received by the adder, two more bits equivalent to a +1 (P1) and a −1 (N1) can be received from the coder 610 via a discrete delay 630. Assuming that the P1 and N1 signals are equivalent to the least significant bits (LSBs) of the example of FIG. 4, the resultant effect is that the current control device 620 will not receive the all the analog information as it is fed to the adder 640, but instead LSBs can be fed back such that they can be presented to the current control device 620 on the next clock. For example, if a stream of numbers {+3, +2, −3} is fed to the adder 640 (and assuming that the delay 630 has a "0" internal state), the +3 will be fed from the adder 640 to the coder 610 unaltered while lines P2 and P1 are activated. Instead of being presented to the current control device 620, the P1 signal represents one or more missing states/missing codes that the current control device cannot accommodate. That is, the only available states that the current control device can accommodate are {+4, +2, 0, −2, −4}. However, as the LSB information can be important for proper jitter control, the coder 610 can feed the LSBs back to the adder 640 via the discrete delay 630 so that it may be incorporated in the next cycle.

Continuing with the example above, the initial "3" presented to the coder 610 can cause the coder to present a "+2" to the current control device 620 while providing a "+1" feedback signal to the adder 640. As a result, on the next data cycle, the adder 640 will add the next number in the data stream ("+2") with the "+1" provided via the discrete delay 630 to produce a "+3" sum. This sum, in turn, will be provided to the coder 610, which will again provide a "+2" (P2) to the current control device 620 and a "+1" (P1) feedback. Accordingly, on the next data cycle, the adder 640 will add the next number in the data stream ("−3") with the "+1" provided via the discrete delay 630 to produce a "−2" sum. This sum, in turn, will be provided to the coder 610, which will again provide a "−2" (N2) to the current control device 620 but with no feedback for the next data cycle.

The translation of the coder 610 of FIG. 6 is presented in Table 2 below:

TABLE 2

| INPUT | P4 | P2 | P1 | N4 | N2 | N1 | OUTPUT (normalized) |
|-------|----|----|----|----|----|----|---------------------|
| −4    | 1  | 0  | 0  | 0  | 0  | 0  | +1.00 Volt          |
| −3    | 0  | 1  | 1  | 0  | 0  | 0  | (missing code)      |
| −2    | 0  | 1  | 0  | 0  | 0  | 0  | +0.50 Volt          |
| −1    | 0  | 0  | 1  | 0  | 0  | 0  | (missing code)      |
| 0     | 0  | 0  | 0  | 0  | 0  | 0  | 0.00 Volt           |
| 1     | 0  | 0  | 0  | 0  | 0  | 1  | (missing code)      |
| 2     | 0  | 0  | 0  | 0  | 1  | 0  | −0.50 Volt          |
| 3     | 0  | 0  | 0  | 0  | 1  | 1  | (missing code)      |
| 4     | 0  | 0  | 0  | 1  | 0  | 0  | −1.00 Volt          |

Note that the adder 640 is used to "fill in" for the missing codes. That is, in those situations where there is a missing code, i.e., there is no output available to directly represent an input, the adder provides a "second chance" for the LSB to make its way to current control device 620.

Figure 7:
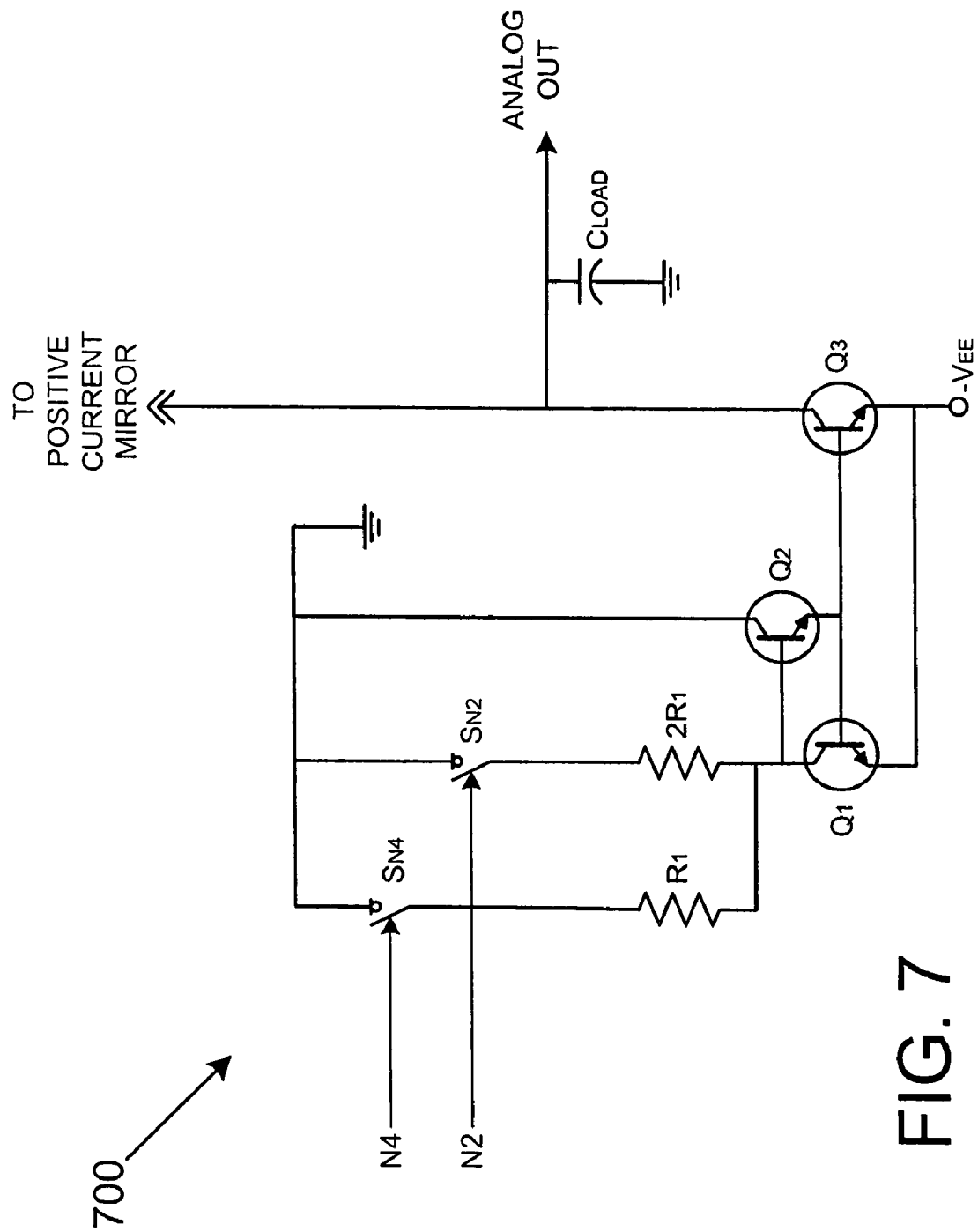
FIG. 7 depicts details of a portion of another exemplary current mirror used in the digital-to-analog conversion system of FIG. 6 according to an illustrative embodiment.

Also note that the exemplary current control device 620 can consists of two current mirrors: one to receive the positive inputs P2 and P4 and provide a positive current source; and one to receive the negative inputs N2 and N4 to provide a negative current source. FIG. 7 depicts details of a portion of another exemplary current mirror 700 used in the digital-to-analog conversion system of FIG. 6 according to an illustrative embodiment. As shown in FIG. 7, the exemplary current mirror 700 has two switches $S_{N2}$ and $S_{N3}$ controlled by inputs N2 and N4, respectively. Each of the switches $S_{N2}$ and $S_{N3}$ is in series with a respective resistor $R_2$ and $R_3$ that serves to provide a specific amount of current to transistors Q1 and Q2. Accordingly, as with the current mirror 500 of FIG. 5, a like amount of current running through transistor Q1 will also run through Q3, thus providing a desired analog output via capacitor $C_{LOAD}$ to the ANALOG OUT line.

Figure 8:
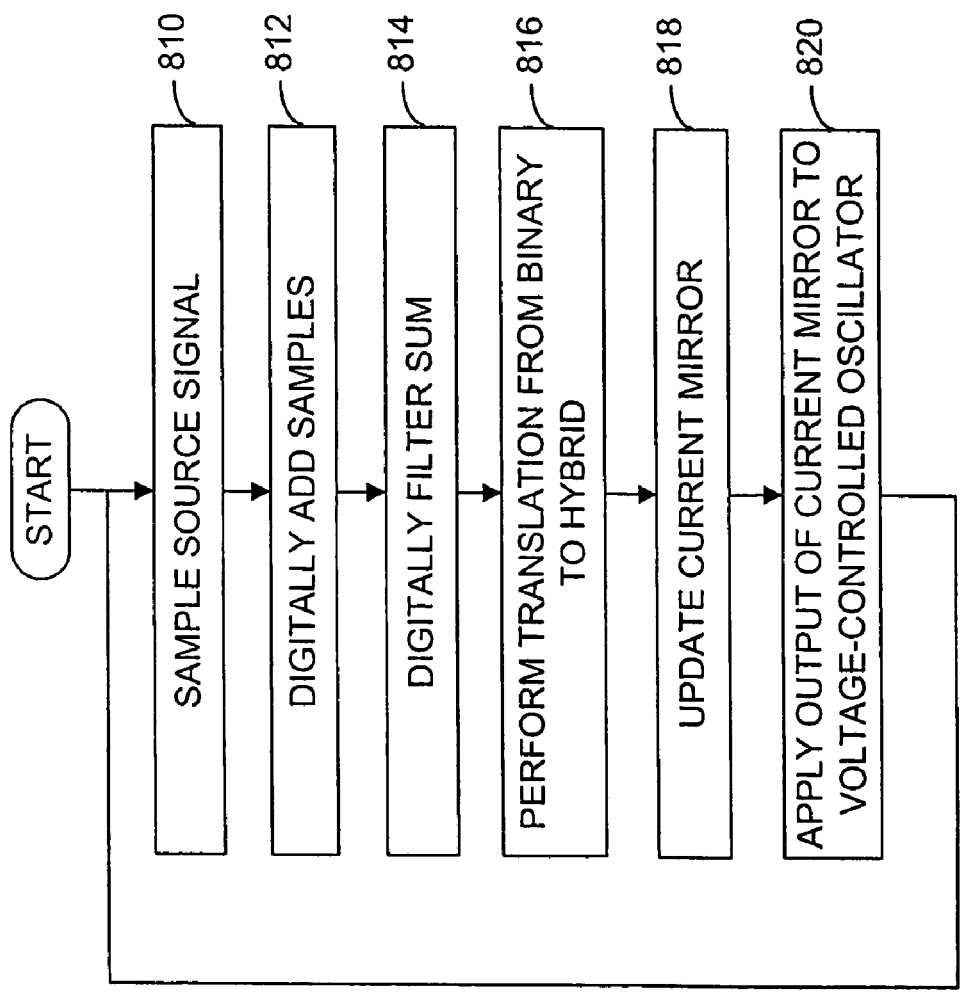
FIG. 8 is a flowchart outlining an exemplary clock recovery process according to an illustrative embodiment.

FIG. 8 is a flowchart outlining an exemplary clock recovery process according to an illustrative embodiment. The process starts in step 810 where a source signal is sampled by an ADC, such as the 1.5 bit ADCs shown in FIGS. 1 and 3. Next, in step 812, the samples of each ADC are added to create a stream of sums/words, and in step 814 the stream of sums/words can be (optionally) filtered to create a stream of filtered data. Control continues to step 816.

In step 816, a "binary to hybrid translation" translation is performed on the filtered data. That is, the each number of the stream of filtered data is transposed into two separate numbers. While the exemplary step uses a translation akin to that presented in Table 1, it should be appreciated that other translations and other dynamic ranges might be used in other embodiments. Control continues to step 818.

In step 818, a current mirror is updated using the translated "hybrid" numbers of step 816. Next, in step 820, the resultant output of the current mirror of step 818 is applied to a VCO, which in turn can change the oscillation rate of the VCO and thus the sample rate of the sampling process of step 810. Control then jumps back to step 810 where the source signal is further sampled.

Figure 9:
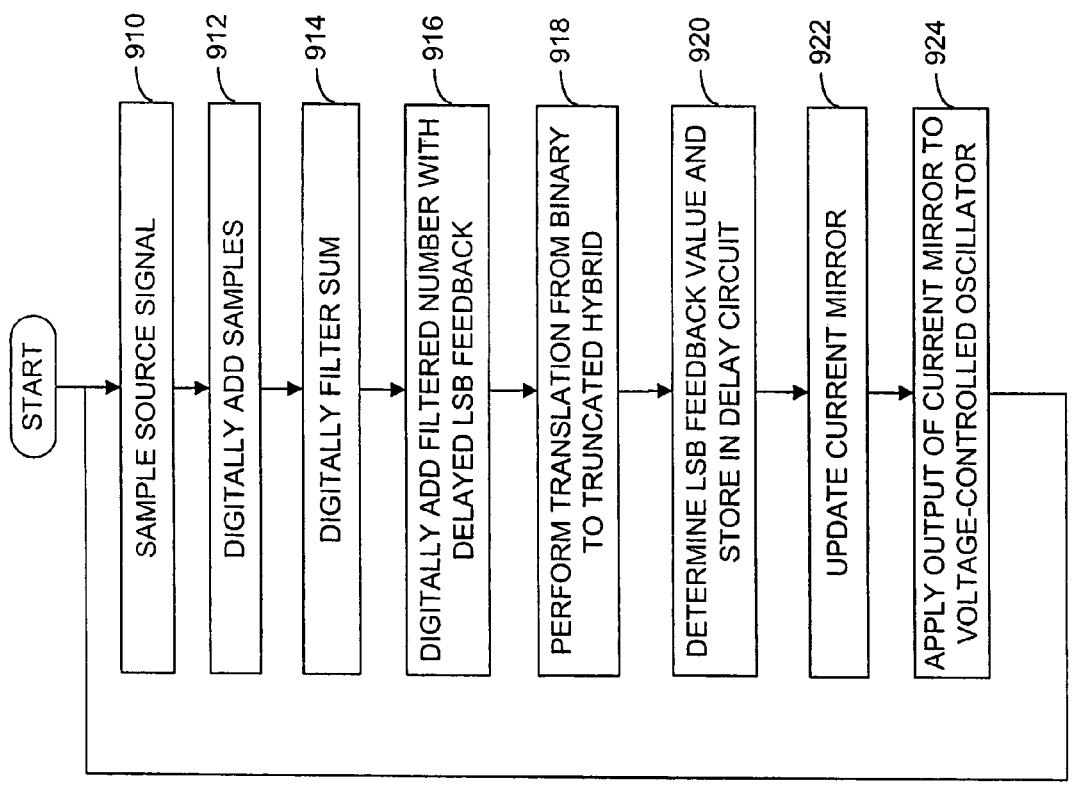
FIG. 9 is a flowchart outlining another exemplary clock recovery process according to an illustrative embodiment.

FIG. 9 is a flowchart outlining another exemplary clock recovery process according to an illustrative embodiment. The process starts in step 910 where a source signal is sampled by an ADC, such as the 1.5 bit ADCs shown in FIGS. 1 and 3. Next, in step 912, the samples of each ADC are added to create a stream of sums/words, and in step 914 the stream of sums/words can be (optionally) filtered to create a stream of filtered data. Control continues to step 916.

In step 916, an entry in the stream of filtered data can be added to an LSB (+1 or −1) to a previously presented entry to produce a second sum. Next, in step 918, a "binary to hybrid translation" translation can be performed on the second sum. That is, the each number of the stream of filtered data is transposed into two separate numbers. While the exemplary step uses a translation akin to that presented in Table 2, it should be appreciated that other translations and other dynamic ranges might be used in other embodiments. Then, in step 920, an LSB can be determined for the transposed numbers and stored in a delay circuit for use when step 916 is next executed. Control continues to step 922.

In step 922, a current mirror is updated using the translated "hybrid" numbers of step 918. Next, in step 924, the resultant output of the current mirror of step 922 is applied to a VCO, which in turn can change the oscillation rate of the VCO and thus the sample rate of the sampling process of step 910. Control then jumps back to step 910 where the source signal is further sampled.

The many features and advantages of the present teachings are apparent from the detailed specification, and thus, it is intended by the appended claims to cover all such features and advantages of the present teachings which fall within the true spirit and scope of the present teachings. Further, since numerous modifications and variations will readily occur to those skilled in the art, it is not desired to limit the present teachings to the exact construction and operation illustrated and described, and accordingly, all suitable modifications and equivalents may be resorted to, falling within the scope of the present teachings.

The invention claimed is:

1. A clock recovery circuit, comprising:
a coding circuit adapted to translate a stream of first digital numbers derived from a source signal into a stream of first binary numbers each ranging from 0 to N and a stream of second binary numbers each ranging from 0 to −N;
a current control device coupled to the coding circuit and configured to provide an analog output based on the streams of first and second binary numbers; and
a voltage-controlled oscillator (VCO) controlled by the analog output and adapted to produce a base clock having a base clock frequency.

2. The clock recovery circuit of claim 1, further comprising:
a plurality of analog-to-digital converters (ADCs) with each ADC adapted to periodically sample the source signal to produce a stream of digitally sampled data; and
a digital adding circuit coupled to the ADCs and adapted to digitally add the digitally sampled data each of the ADCs to produce a stream of digital sums updated at a rate equal to or higher than the base clock frequency.

3. The clock recovery circuit of claim 2, wherein the ADCs are adapted to sample the source signal based on respective outputs of a multi-phased clock, the multi-phased clock adapted to produce four output clock signals that transition at relative phase angles of 0°, 90°, 180° and 270° the base clock.

4. The clock recovery circuit of claim 3, wherein each digital sum of the stream of digital sums is derived from the addition of a single digital sample of each ADC.

5. The clock recovery circuit of claim 4, wherein the bank of multiple ADCs includes four ADCs having a resolution of 1.5 bits.

6. The clock recovery circuit of claim 5, wherein the digital adding circuit has a resolution of at least 4 bits.

7. The clock recovery circuit of claim 5, wherein the digital adding circuit has a range of negative 4 to + positive 4.

8. The clock recovery circuit of claim 2, wherein the stream of first digital numbers is the stream of digital sums.

9. The clock recovery circuit of claim 2, wherein the stream of first digital numbers is derived from the stream of digital sums.

10. The clock recovery circuit of claim 9, further comprising:
a digital filter coupled to the adding circuit and adapted to produce a stream of filtered sums, wherein the stream of first digital numbers is the stream of filtered sums.

11. The clock recovery circuit of claim 6, wherein the coding circuit includes a feedback signal adapted to cause the coding circuit to increment or decrement a subsequent output number in the stream of first binary numbers.

12. The clock recovery circuit of claim 6, wherein the coding circuit includes a feedback signal adapted to cause the coding circuit to increment a subsequent output number in the stream of first binary numbers or decrement a subsequent output number in the stream of second binary numbers.

13. The clock recovery circuit of claim 11, wherein the current control device has at least one missing code and is constructed using two binary current mirrors.

14. The clock recovery circuit of claim 1, wherein the DAC is constructed using two binary current mirrors.

15. A clock recovery circuit, comprising:
a bank of multiple analog-to-digital converters (ADCs) with each ADC adapted to sample a common source signal using a respective output clock signal of a multi-phased clock device to produce a stream of digital output samples;
an adding device adapted to add the last output sample of the stream of digital output samples of each of the ADCs;
a coding means coupled to the adding device for converting first digital signals derived from the adding device into a stream of first binary numbers each ranging from 0 to N and a stream of second binary numbers each ranging from 0 to −N, wherein N is a positive integer; and
a conversion means for providing an analog control signal to a voltage controlled oscillator based on the first and second streams of binary numbers.

16. The clock recovery circuit of claim 15, wherein the conversion means has a bit resolution lower than the bit resolution of the adding device.

17. The clock recovery circuit of claim 16, wherein the coding means includes a feedback means for incrementing or decrementing a subsequent number in the stream of first binary numbers when the conversion means does not have an output code representative of a present number in the stream of first binary numbers.

18. The clock recovery circuit of claim 15, wherein the bank of multiple ADCs includes four ADCs having a resolution of 1.5 bits.

19. The clock recovery circuit of claim 15, wherein the adding device is a digital adding circuit that has a resolution of at least 4 bits.

20. The clock recovery circuit of claim 15, wherein the adding device is a digital adding circuit the has a range of negative 4 to positive 4.

21. The clock recovery circuit of claim 15, wherein the coding means is a coding circuit that includes a feedback signal adapted to cause the coding circuit to increment or decrement a subsequent output number in the stream of first binary numbers.

22. The clock recovery circuit of claim 15, wherein the coding means is a coding circuit that includes a feedback signal adapted to cause the coding circuit to increment a subsequent output number in the stream of first binary numbers or decrement a subsequent output number in the stream of second binary numbers.

23. A method for performing clock recovery for a source signal, comprising:
   digitally sampling the source signal to produce digital samples at a rate 4 times that of a base clock frequency and at a resolution of 1.5 bits to produce a stream of digital samples;
   digitally adding the last 4 digital samples of the stream of digital samples to produce a stream of digital sums;
   coding either the stream of digital sums or a stream of digital filtered sums derived from the stream of digital sums into two separate streams of binary numbers;
   converting the two separate streams of binary numbers into a single analog output using a positive current mirror and a negative current mirror; and
   providing the analog output to a voltage controlled oscillator.

24. The method of claim 23, wherein the step of coding includes producing a feedback signal causing a subsequent number of one of the two separate streams of binary numbers to increment.

25. The method of claim 23, wherein the step of digitally adding periodically adds four digital samples having 1.5 bits of resolution each to produce a binary sum ranging from 4 to +4.

26. A clock recovery circuit, wherein the clock recovery circuit comprises:
   a coding circuit adapted to translate a stream of first digital numbers derived from a source signal into a stream of binary numbers, and wherein the coding circuit includes a feedback signal adapted to cause the coding circuit to increment or decrement a subsequent output number in the stream of binary numbers;
   a current control device coupled to the coding circuit and configured to provide an analog output based on the streams of first and second binary numbers; and
   a voltage-controlled oscillator (VCO) controlled by the analog output and adapted to produce a base clock having a base clock frequency.

* * * * *